United States Patent [19]

Kosugi et al.

[11] Patent Number: 4,958,322
[45] Date of Patent: Sep. 18, 1990

[54] SEMICONDUCTOR PSEUDO MEMORY MODULE

[75] Inventors: Ryuichi Kosugi; Tsugio Tabaru, both of Hyogo, Japan

[73] Assignee: Mitsubishi Denki Kabushiki Kaisha, Tokyo, Japan

[21] Appl. No.: 376,067

[22] Filed: Jul. 6, 1989

[30] Foreign Application Priority Data

Jul. 6, 1988 [JP] Japan .................................. 63-168424

[51] Int. Cl.$^5$ ........................................... G11C 13/00
[52] U.S. Cl. ............................ 365/189.01; 365/189.02; 365/222; 365/63
[58] Field of Search ...................... 365/189.01, 189.03, 365/189.02, 222, 63, 230.02, 230.01

[56] References Cited

U.S. PATENT DOCUMENTS 4,811,078  3/1989  Tigelaar et al. ................. 365/189.01

Primary Examiner—Terrell W. Fears
Attorney, Agent, or Firm—Lowe, Price, LeBlanc, Becker & Shur

[57] ABSTRACT

A semiconductor pseudo memory module includes a multilayer wiring substrate on the surface of which a plurality of DRAMs are provided and on the reverse side of which semiconductor devices of the DRAM controller and multiplexers are provided, these devices being electrically connectetd with one another by a wiring layer. The address signals supplied from outside are converted into column address signals and row address signals by the multiplexer so as to be supplied to each DRAM. Responsive to control signals supplied from outside, the DRAM controller generates a refresh signals for refreshing the DRAMS, which signal is supplied to the DRAM. In this manner, the DRAM may be used as the SRAM.

4 Claims, 7 Drawing Sheets

FIG.5A
○ PINS ENCLOSED IN CIRCLES ARE INTERCHANGEABLE
N.C = NO CONNECTION
FIG.5B PRIOR ART
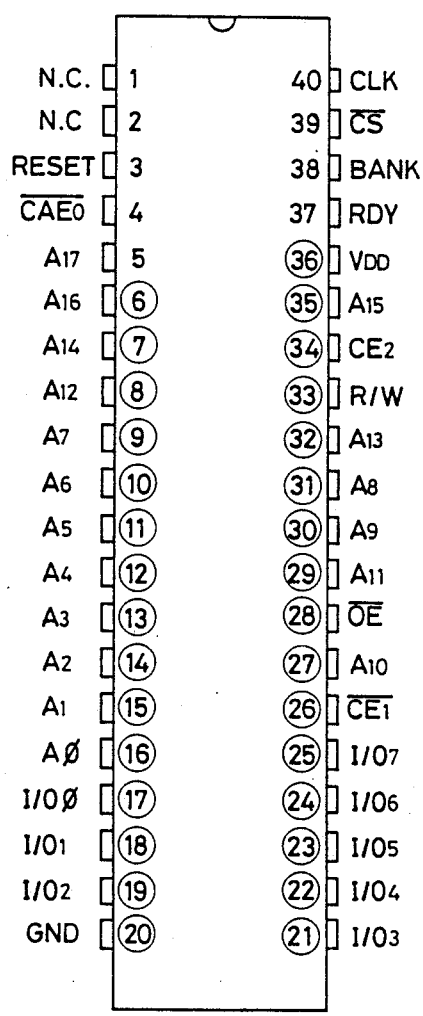
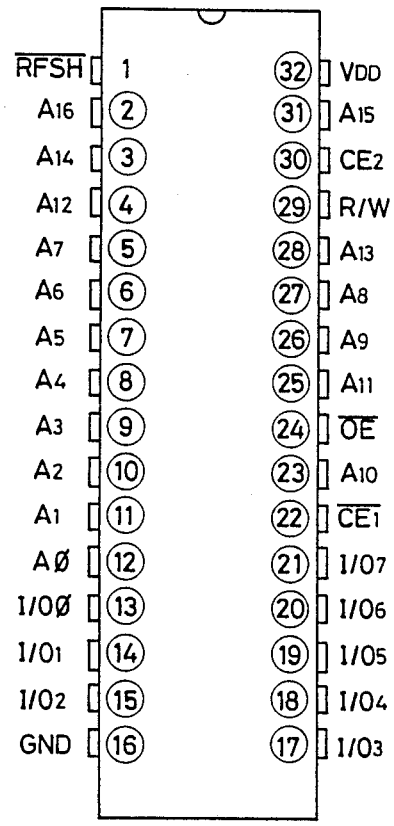

SEMICONDUCTOR PSEUDO MEMORY MODULE

BACKGROUND OF THE INVENTION

1. Field of the Invention

This invention relates generally to pseudo memory devices wherein DRAM is operated to function as SRAM, and more particularly, to a pseudo memory module having large memory capacity and being pin compatible with a pseudo memory device having a smaller memory capacity.

2. Description of the Background Art

Prior to discussing the structure and operation of a pseudo memory device in the prior art to which the invention is directed, some background on the structure and operation of the DRAM circuit is helpful. Thus, referring to FIG. 6, there is shown in a block diagram a prior art combination of a CPU, a DRAM and an interface circuit connected therebetween. Referring to FIG. 6, a DRAM 1 is connected to a multiplexer 2 adapted for affording sets of address signals by the combination of row and column address signals in the usual manner. A timing controller 3a is provided for affording a priority sequence among refresh request, a data readout request to the DRAM 1 and a data writing request to the DRAM 1. A control signal driver 3b is provided for producing control signals for the DRAM 1. A clock generator 6a is provided for producing clock signals supplied to CPU 5 for its operation and clock signals supplied to peripheral circuits for their synchronization. An address latch 7 is provided for latching only address signals outputted to an address data of the common bus of CPU 5. A data buffer 8 is provided for controlling the data input and output to and from the data bus of CPU 5.

The operation of the DRAM 1 responding to the access request from CPU 5 is explained. The timing controller 3a is responsive to the access request supplied from CPU 5 (status signal) to produce an operation control signal for DRAM 1. This operation control signal is supplied via control signal driver 3b to DRAM 1. The CPU 5 outputs address signals to the address data common bus. This address signal is latched in the address latch 7 and thence supplied to the address multiplexer 2. The address multiplexer 2 converts a serial address signals stored in parallel in address latch 7 into multiplexed address signal for controlling the DRAM 1 in a usual manner. The operation of accessing the DRAM 1 is performed in this manner. The data readout from DRAM 1 are supplied via data buffer 8 to CPU 5. The data buffer 8 is controlled by the timing controller 3a.

In the refreshing operation of the DRAM 1, the timing controller 3a is responsive to clock signals generated by clock generator 6a to produce refresh signals.

In the above described system shown in FIG. 6, interfacing circuits such as timing controller 3a or control signal driver 3b need be provided for cooperation with CPU 5 thereby complicating the peripheral circuits and enlarging the space necessary for providing the circuits.

A pseudo static RAM (PS RAM), or a virtual static RAM (VS RAM) commonly known to the prior art performs a function of SRAM using the DRAM. FIG. 7 is a schematic block diagram showing an example of the one-chip PS/VS RAM. An array of memory cell 1a includes a plurality of memory cells arranged in a plurality of rows and a plurality of columns, and data are stored in each of the memory cells. A column decoder 1b and a row decoder 1c are provided for specifying an address of the memory cells of the array 1a and a sense amplifier 1d is provided for reading out data in the memory cells. A refresh timer 3c is provided for setting an internal refresh time and a refresh counter 3e is provided for setting the timing of the refresh time by external control. An arbiter circuit 3f is provided for receiving refresh and access requests and determining the priority sequence among the requested operations. A clock generator 3g is provided for generating access requests. A column address buffer 9a is provided for temporarily storing column address signals and supplying the stored signals to the column decoder 1b. A row address buffer 9b temporarily stores the row address signals and supplies the stored signal to the row decoder 1c via arbiter circuit 3f.

Referring now to FIG. 7, the operation of one-chip PS/VS RAM is explained. When a CE signal from a CPU, not shown is applied to clock generator 3g, the clock generator 3g generates and access request signal. This access request signal is inputted to the arbiter circuit 3f where memory control signals are generated. The address signals are supplied to and latched in a latch circuit, not shown, from the address data common bus of the CPU, the output from the latch circuit being then introduced to the column address buffer 9a and the row address buffer 9b. The column address signal introduced into the column address buffer 9a designates the column address of the array of memory cells 1a via column decoder 1b, while the row address signal introduced into the row address buffer 9b is supplied to the array of memory cells 1a via arbiter circuit 3f and row decoder 1c to designate the row address.

The data to be written into the array of memory cells 1a are introduced via data input buffer 8a to the sense amplifier 1d, while the data readout from the array of memory cells 1a are outputted via output buffer 8b.

The refresh operation includes two kinds of operations, namely an external signal sync mode operation and an internal automatic mode operation. In the case of the external signal sync mode, the refresh operation is controlled by the refresh counter 3e, and, in the case of the internal automatic mode, the refresh operation is performed at a certain prescribed period by the arbiter circuit 3f acted by refresh timer 3c.

As described hereinabove, the one-chip PS/VS RAM shown in FIG. 7 includes in the form of one chip, all the portions of the circuit of FIG. 6 except for the CPU 5 and the address latch 7. Hence, an advantage is derived that the peripheral circuits may be simplified and the space necessary for mounting the circuit may be reduced. However, the memory capacity of one chip IC is limited. Moreover, the provision of complicated internal circuits results in increased cost per bit of the memory.

Furthermore, pseudo SRAM devices that currently are available have a common, or "standard", pin lay-out around which external circuit configurations are usually designed. Even if the memory capacity of pseudo SRAM device can be increased, it is desirable to retain the standard pin lay-out.

DISCLOSURE OF THE INVENTION

It is an object of the present invention to increase the memory capacity of a pseudo SRAM or semiconductor pseudo memory module.

It is another object of the present invention to provide a semiconductor pseudo memory module containing components at higher density to reduce the space necessary for mounting.

It is a further object of the present invention to provide an interfacing circuit between a CPU and DRAM for simulating SRAM operations.

It is a still further object of the present invention to increase the memory capacity of pseudo semiconductor memory device without changing its fundamental pin lay-out for compatibility with other pseudo semiconductor devices having a smaller memory capacity.

Stated briefly, this invention provides a pseudo semiconductor memory device in which the simulated dynamic random access memory may be simulatedly employed as the static random access memory. In the semiconductor pseudo memory module of the present invention, semiconductor devices of the dynamic random access memory, a semiconductor device for converting address signals and a control semiconductor devices are provided on a multilayer wiring substrate provided with external connecting terminals. The address signals introduced into any one of the external connection terminals adapted therefore are converted into address signals for designating the addresses of the dynamic random access memory by the semiconductor devices adapted for converting the address signals. The dynamic random access memory is controlled responsive to the control signals supplied to any one of the external connection terminals to effect rewriting.

According to the semiconductor pseudo memory module of the present invention, semiconductor devices of the dynamic random access memory, the semiconductor devices for converting address signals for address multiplexing and the control semiconductor device for controlling the refreshing are provided as one package on the multilayer wiring substrate. The result is the simplified interfacing between the CPU and the DRAM.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5A is a view showing the designations of the input and output signals to and from the external connection terminals of the pseudo SRAM module embodying the present invention.

FIG. 5B is a view showing the designations of the input and output signals to and from the external connection terminals of a 1M bit one-chip PS/VSRAM employed in the prior art.

DESCRIPTION OF THE PREFERRED EMBODIMENTS

Figure 1A:
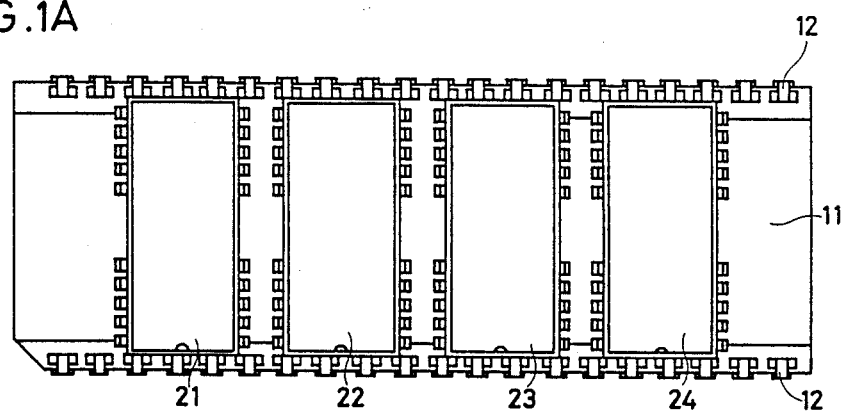
FIGS. 1A to 1D show outward aspects of an embodiment of the present invention.
Figure 1B:
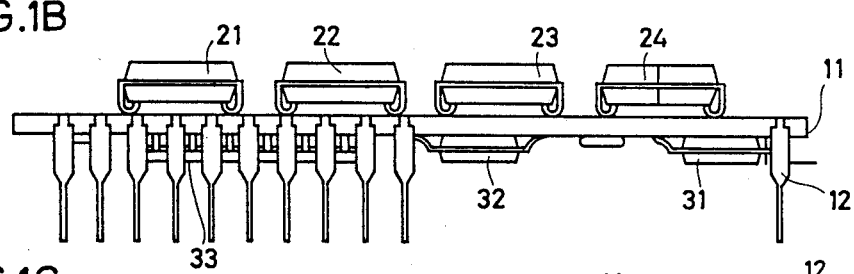
Figure 1C:
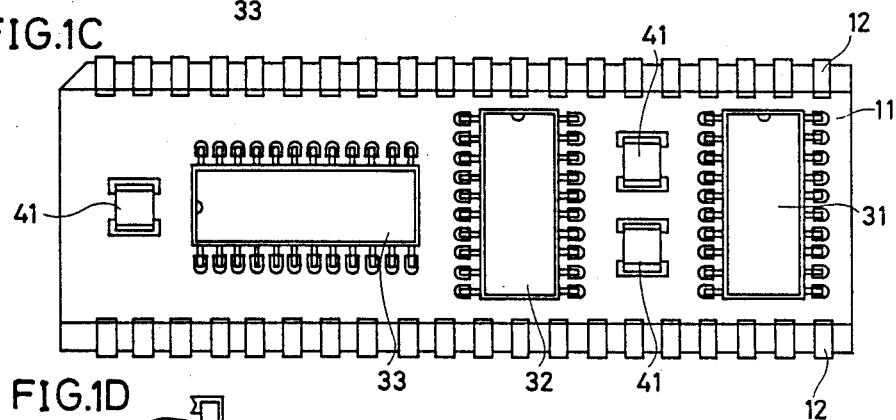
Figure 1D:
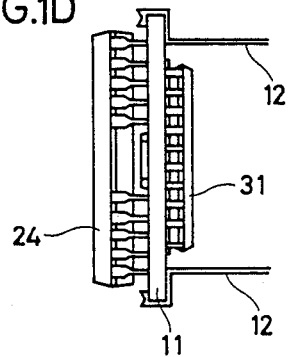
Figure 2B:
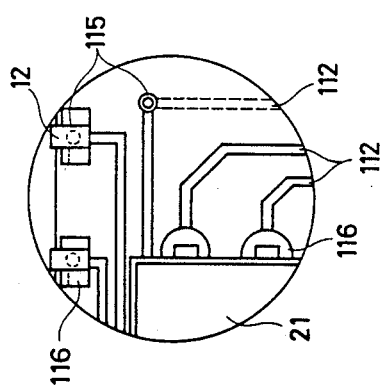
FIGS. 2A to 2D illustrate the mounting structure of the multilayer wiring board or substrate and the semiconductor devices.
Figure 2D:
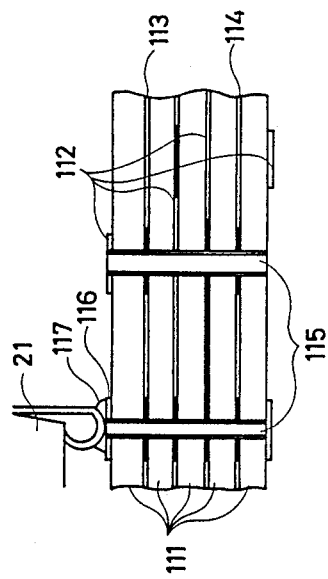
Figure 2A:
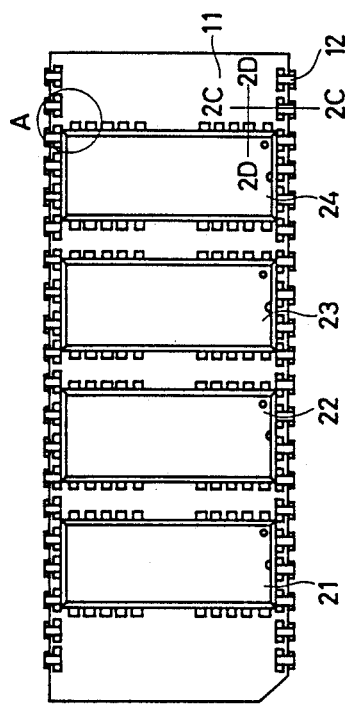
Figure 2C:
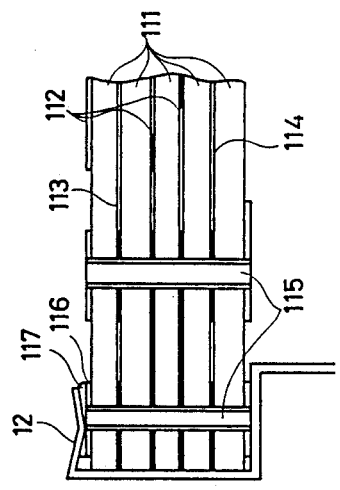

As shown in FIGS. 1A to 1D as described later, a multilayer wiring substrate 11 includes a plurality of layers in each of which there is formed a copper wiring. On both lateral sides of the substrate 11, a large number of external connection terminals 12 are attached for extending downwards. Four 1M-bit DRAMs 21 to 24 are attached on the front side of the substrate 11, while two multiplexers 31, 32, for example, "M66212 or 213FP" produced by Mitsubishi and a DRAM controller 33, for example, "M66200FP" produced by Mitsubishi are attached on the reverse side of the substrate 11. On the reverse side of the substrate 11, a plurality of chip capacitors 41 are connected between the power source line and the ground line. There are also attached chip capacitors, not shown, on the front side of the substrate 11 below the DRAMs 21 to 24.

Referring to FIGS. 2A to 2D, the multilayer wiring substrate 11 includes five laminated insulating layers 111. Between the adjacent layers, a power source layer 113, a grounding layer 114 and a copper wiring 112 are formed. The copper wiring 112 is formed on the front and the reverse sides of the substrate 11 as well as intermediate layers. These layers 113, 114 and 112 form an electric wiring according to the wiring diagram shown in FIG. 3 as later described. The wiring 112, the power source layer 113 and the grounding layer 114 are connected electrically, if necessary, by means of a through-whole 115 passing through the substrate 11.

On the front and reverse sides of the substrate 11, there are formed pads 116 at the attachment portions for the external connection terminals 12 and at the attachment portion corresponding to the connection terminals of the DRAMs 21 to 24, multiplexers 31, 32 and DRAM controller 33. On each hand pads 116, the external connection terminal 12 and the connecting terminals of the DRAMs 21 to 24, multiplexers 31, 32 and DRAM controller 33 are interconnected electrically by a solder 117.

Figure 3:
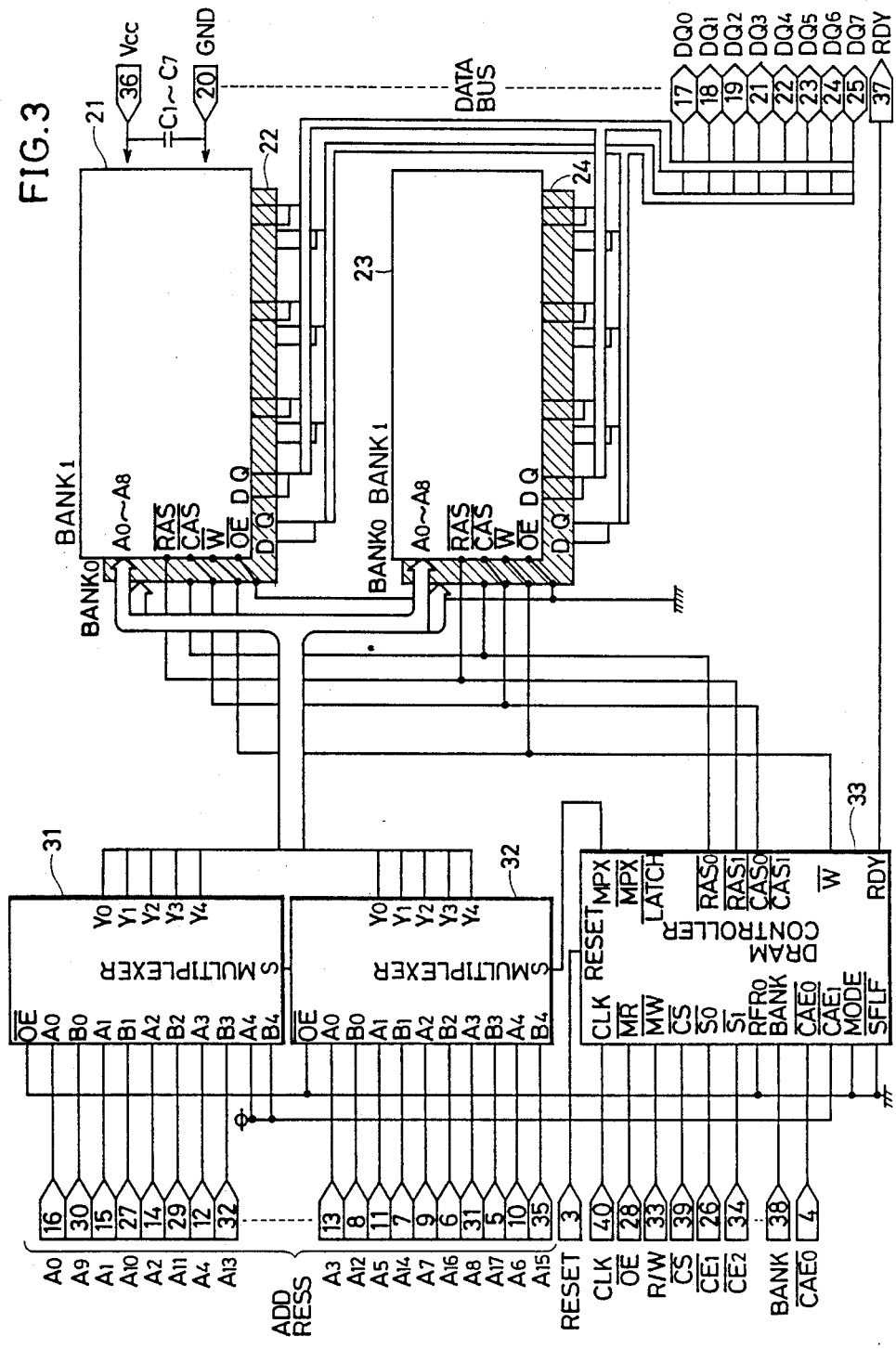
FIG. 3 is a wiring diagram of an embodiment of the present invention.

FIG. 3 shows a connection diagram showing an embodiment of the present invention.

Referring to FIG. 3, each of the DRAMs 21 to 24 stores data supplied to or outputs to the data buses DO0 to DO7 connected to the external connection terminals 12. Each of the multiplexers 31 and 32 selects the address signals supplied from the CPU to the external connection terminals 12 and outputs the column address signals and row address signals to the address inputs A0 to A8 of the DRAMs 21 to 24. The DRAM controller 33 latches the access request signals supplied from the CPU, not shown, to the external connection terminal 12 and generates signals for controlling the DRAMs 21 to 24, while counting the clock signals supplied from the CPU to the external connection terminals 12 and generating internally the refresh request signals to effect the refresh control of the DRAMs 21 to 24. The refresh control may however be performed directly from outside without the intermediary of the DRAM controller 33. The above described connection pattern is formed on the multilayer wiring substrate shown in FIGS. 1A to 2D as the wiring pattern.

Figure 4:
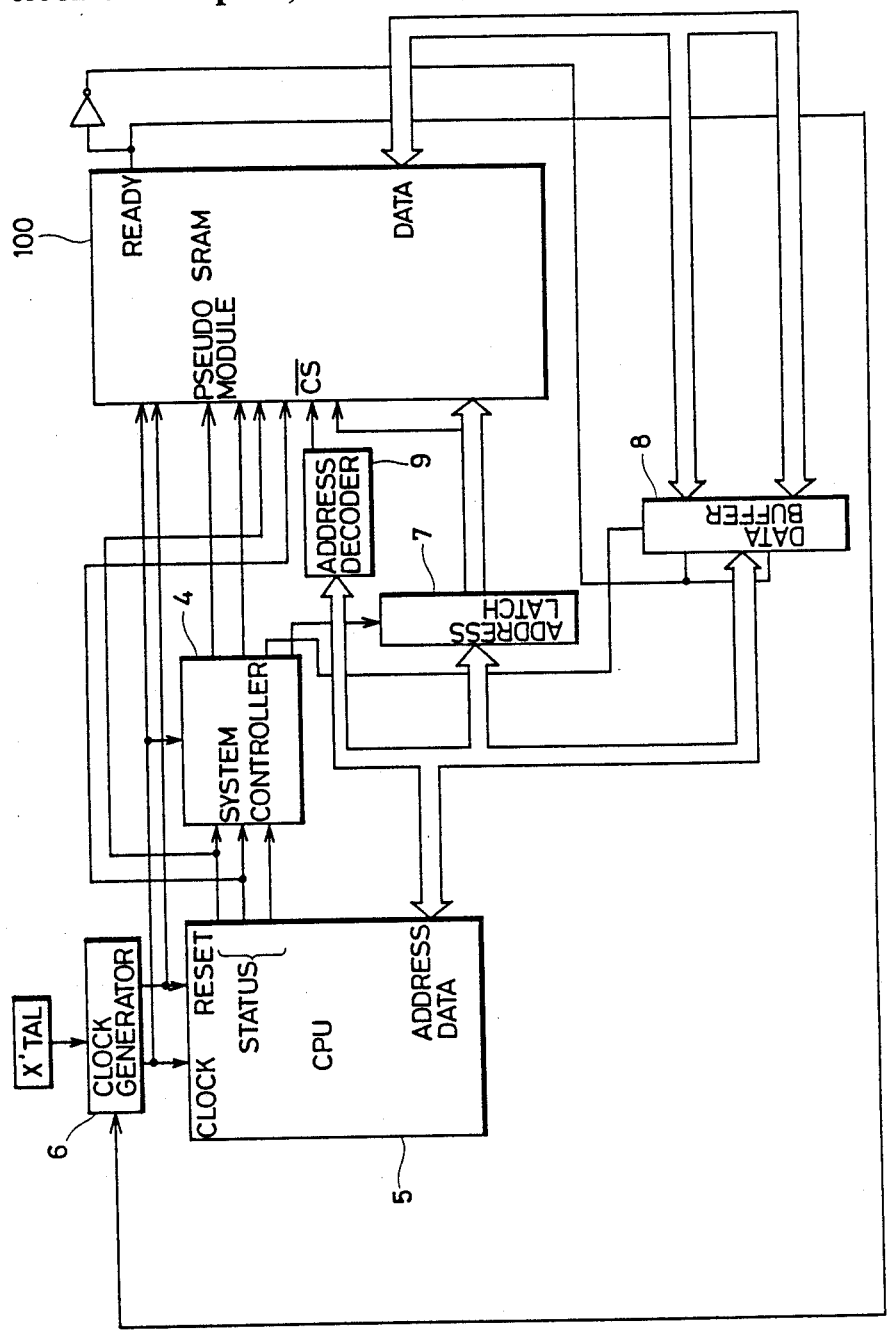
FIG. 4 is a block diagram showing an example of application for accessing the pseudo SRAM module embodying the present invention by the CPU.
Figure 6:
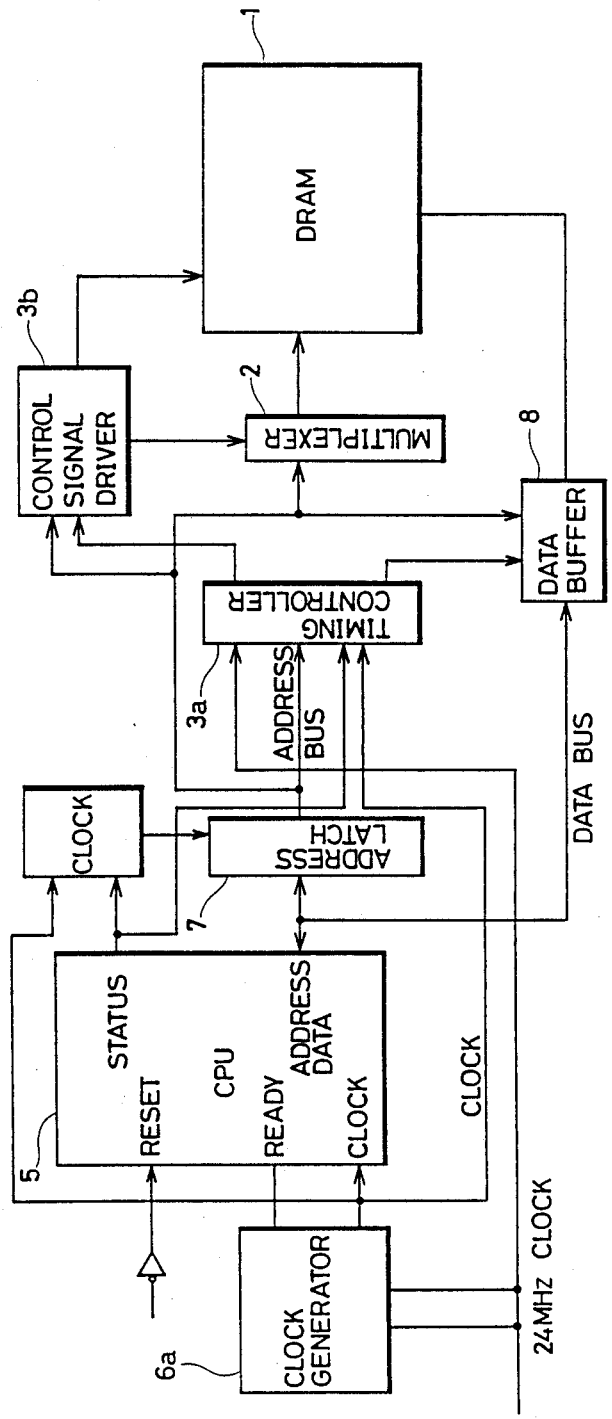
FIG. 6 is schematic block diagram showing a conventional combination including the CPU, DRAM and the interfacing circuits connected therebetween.
Figure 7:
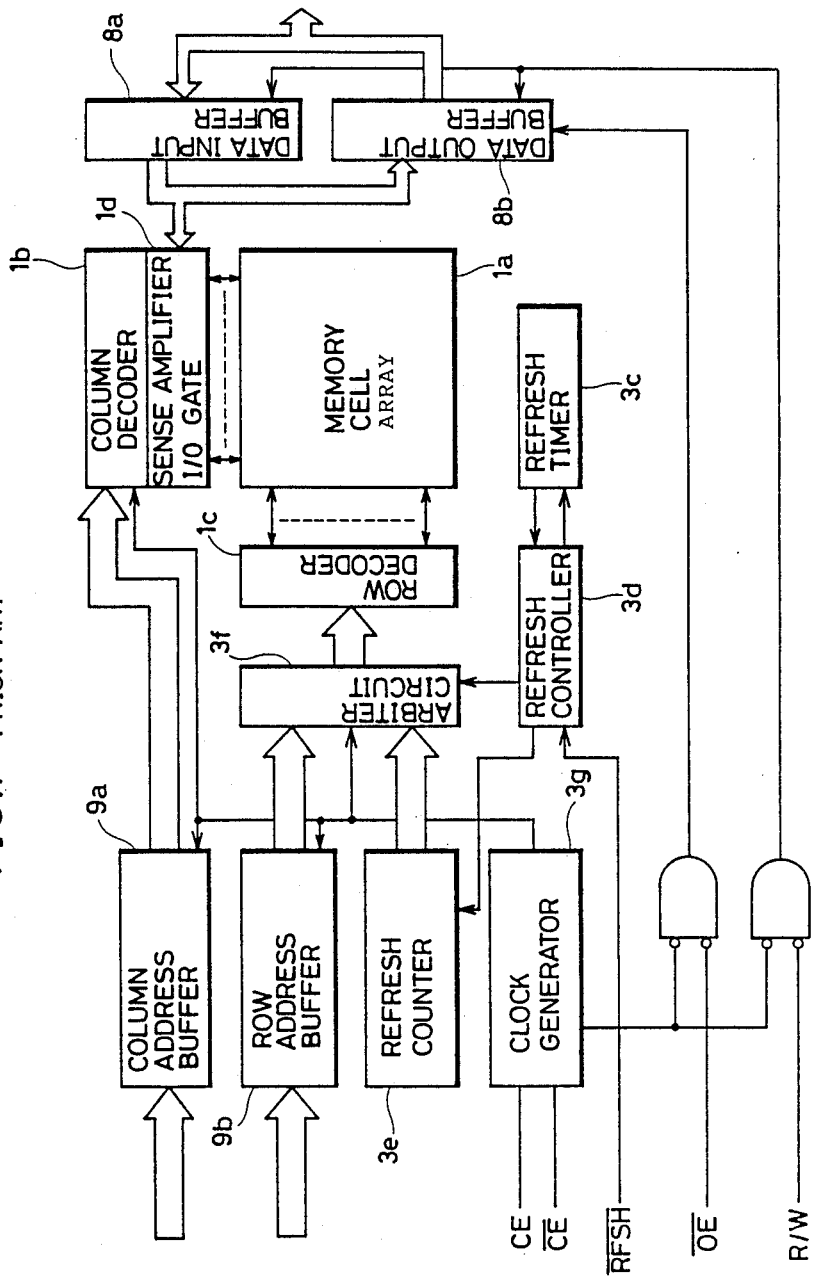
FIG. 7 is a schematic block diagram of a conventional pseudo SRAM.

FIG. 4 is a block diagram showing an example of application for accessing the pseudo SRAM module of an embodiment of the present invention by the CPU.

Referring to FIG. 4, "8086" (intel), for example, is used as the CPU 5, to which a system controller 4 and a clock generator 6 are connected. The clock generator 6 generates clock signals or reset signals to be applied to the CPU 5 and controls the ready signal indicating whether accessing can be made or not. An address latch 7, a data buffer 8 and an address decoder 9 are connected to the CPU 5 via address data common bus. The address latch 7 latches only the address signals outputted to the address data common bus, while the data buffer 8 controls the data input and output between the CPU 5 and the pseudo SRAM module 100. The address decoder 9 reads the access request signals outputted from the CPU 5 and supplies the signals to the pseudo SRAM module 100.

Referring to FIG. 4, the operation of accessing the pseudo SRAM module 100 is now explained. When the address signal is supplied from the CPU 5 to the address decoder 9, a chip select signal $\overline{CS}$ is produced from the address decoder 9, this chip select signal being supplied to the pseudo SRAM module 100 to select the memory space. When the access request signal (status signal) is supplied from the CPU 5 to the pseudo SRAM module 100 via system controller 4, the access request signal is supplied to the DRAM controller 33 shown in FIG. 3 and a control signal for controlling the DRAM is generated by this DRAM controller 33.

The address signal outputted by the CPU 5 is latched by the address latch 7 via address data bus. The latched address signal is supplied to multiplexers 31 and 32 of the pseudo SRAM module 100 and the column address signals and the row address signals are selected and supplied to the DRAMs 21 to 24. The data input and output lines of the DRAMs 21 to 24 and the data bus of the CPU 5 are connected so as to be controlled by the data buffer 8. For refreshing the DRAMs 21 to 24, the DRAM controller 33 counts the clock signals supplied thereto to output refresh requests.

FIG. 5A is a view showing the designations of the input and output signals at the external connection terminals of the pseudo SRAM module according to an embodiment of the present invention, and FIG. 5B is a view showing the designations of the input and output signals of the external connection terminals of "TC 518828P", manufactured by Toshiba, as a typical example of the 1M-bit one-chip PS/VSRAMs available on the market.

As shown in FIG. 5B, the conventional 1M-bit one-chip PS/VRAM includes one chip semiconductor device having 32-pin external terminals. In contrast thereto, the pseudo SRAM module according to an embodiment of the present invention includes 40-pin external terminals, as shown in FIG. 5A, with the terminals common to these of the PSRAM being pin-compatible therewith so that two devices can be made interchangeable. According to an embodiment of the present invention, the memory capacity may be increased by a factor of four, when compared with the conventional 1M-bit one-chip PS/VSRAM, by simply adding 8-pin external terminals.

It is seen from the foregoing that, according to an embodiment of the present invention, the DRAM, the semiconductor device for converting the address signals and control semiconductor device are provided on the multilayer wiring substrate as one package, and are provided with the external connection terminals, so that interchangeability may be afforded with the conventional SRAMs or one-chip PS/VSRAM, while the interfacing circuits between the CPU and the DRAM may be simplified and the mounting or attachment density of the semiconductor devices may be increased. In addition, an electronic circuit device may be provided which has a larger memory capacity than that of the conventional one-chip PS/VSRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor pseudo memory module in which functions of a static random access memory are provided by a dynamic random access memory, comprising:

a multilayer wiring substrate having external connection terminals;

a plurality of dynamic random access memory devices mounted on said substrate;

a semiconductor multiplexing device mounted on said substrate for converting address signals applied to said connection terminals into address signals compatible to said dynamic random access memory devices; and a semiconductor refresh control device mounted on said substrate and responsive to signals applied to said external dynamic random access memory;

at least two of said dynamic random access memory devices, said multiplexing device and said refresh control device being interconnected through multiple wiring layers of said substrate.

2. The semiconductor pseudo memory module according to claim 1, wherein said dynamic random access memory devices are mounted on one side of said substrate, and said multiplexing and refresh control devices are mounted on the opposite side of said substrate.

3. The semiconductor pseudo memory module according to claim 2, wherein said dynamic random access memory includes a plurality of elements, and wherein said semiconductor device for converting address signals includes a device for commonly supplying column address signals and row address signals to said plurality of elements.

4. The semiconductor pseudo memory module according to claim 1, wherein said multilayer wiring substrate includes a power source layer, a wiring layer, a grounding layer and an insulating layer for insulating each of these layers, and if necessary, for components for electrically connecting said wiring layer and said grounding layer and for electrically connecting said power source layer and said wiring layer.

* * * * *